United States Patent
Son et al.

(10) Patent No.: US 12,456,637 B2
(45) Date of Patent: Oct. 28, 2025

(54) SUBSTRATE PROCESSING APPARATUS AND SUBSTRATE PROCESSING METHOD

(71) Applicant: Semes Co., Ltd., Cheonan-si (KR)

(72) Inventors: Youngjun Son, Cheonan-si (KR); Taehoon Lee, Osan-si (KR)

(73) Assignee: Semes Co., Ltd., Cheonan-si (KR)

( * ) Notice: Subject to any disclaimer, the term of this patent is extended or adjusted under 35 U.S.C. 154(b) by 408 days.

(21) Appl. No.: 18/192,246

(22) Filed: Mar. 29, 2023

(65) Prior Publication Data

US 2023/0317477 A1     Oct. 5, 2023

(30) Foreign Application Priority Data

Apr. 4, 2022   (KR) .................. 10-2022-0041919

(51) Int. Cl.
  *H01L 21/67*   (2006.01)
  *H01L 21/027*  (2006.01)

(52) U.S. Cl.
  CPC ........ *H01L 21/6715* (2013.01); *H01L 21/027* (2013.01)

(58) Field of Classification Search
  None
  See application file for complete search history.

(56) References Cited

U.S. PATENT DOCUMENTS

| | | | |
|---|---|---|---|
| 11,647,577 B2 * | 5/2023 | Ramachandran | H05F 3/06 134/61 |
| 2008/0067368 A1 * | 3/2008 | Avery | H01L 21/67253 250/305 |
| 2020/0168478 A1 | 5/2020 | Jung et al. | |

FOREIGN PATENT DOCUMENTS

| | | |
|---|---|---|
| JP | 2002-192151 A | 7/2002 |
| KR | 20-1999-0039625 U | 11/1999 |
| KR | 10-2010-0049857 A | 11/2008 |
| KR | 10-2020-0062831 | 6/2020 |
| KR | 10-2022-0011866 | 2/2022 |

OTHER PUBLICATIONS

Notice of Allowance dated Jul. 18, 2024 for Korean Patent Application No. 10-2022-0041919 and its English translation from Global Dossier.

(Continued)

*Primary Examiner* — Benjamin P Sandvik
(74) *Attorney, Agent, or Firm* — WOMBLE BOND DICKINSON (US) LLP

(57) ABSTRACT

A substrate processing apparatus includes a substrate supporter supporting a substrate, and a processing solution supply apparatus configured to supply a processing solution onto the substrate supported on the substrate supporter, wherein the processing solution supply apparatus includes a trap tank storing the processing solution, a supply line connected to the trap tank to supply the processing solution onto the substrate, a first vent line connected to the trap tank to discharge the processing solution including bubbles or gases from the trap tank, and a first static charge measurement unit connected to the first vent line to measure a static charge of the processing solution, and including a first Faraday cup and a first static charge measurement unit connected to the first Faraday cup.

20 Claims, 9 Drawing Sheets

(56) References Cited

OTHER PUBLICATIONS

Mohsen Mohammadnejad, et al.: Energy spectrum of argon ions emitted from Filippov type Sahand plasma focus: 2013: The Review of scientific instruments.

Vahid Damideh, et al.: Fast Faraday cup for fast ion beam TOF measurements in deuterium filled plasma focus device and correlation with Lee model, Physics of Plasmas 24, 063302 (2017).

* cited by examiner

SUBSTRATE PROCESSING APPARATUS AND SUBSTRATE PROCESSING METHOD

CROSS-REFERENCE TO RELATED APPLICATION

This application is based on and claims priority under 35 U.S.C. § 119 to Korean Patent Application No. 10-2022-0041919, filed on Apr. 4, 2022, in the Korean Intellectual Property Office, the disclosure of which is incorporated by reference herein in its entirety.

BACKGROUND

1. Field

The disclosure relates to a substrate processing apparatus and a substrate processing method.

2. Description of the Related Art

Among semiconductor manufacturing processes, a photolithography process is a process for forming a desired pattern on a substrate such as a wafer. A facility for sequentially or selectively performing a photolithography process performs a coating process, a bake process, and a development process. A resist solution or developing solution is coated onto a substrate in a coating process or a development process, or various cleaning solutions are coated onto a substrate in a cleaning process. When this type of processing solution is supplied through a pipe, electrostatic charges may be generated in the processing solution due to friction with the pipe. For example, when a resist solution is charged, defects such as dielectric breakdown may occur in a resist pattern using the resist solution.

SUMMARY

There are provided a substrate processing apparatus and a substrate processing method, whereby static charge build-up on a processing solution may be prevented.

Additional aspects will be set forth in part in the description which follows and, in part, will be apparent from the description, or may be learned by practice of the presented embodiments of the disclosure.

According to an aspect of the disclosure, a substrate processing apparatus includes a substrate supporter supporting a substrate, and a processing solution supply apparatus configured to supply a processing solution onto the substrate supported on the substrate supporter, wherein the processing solution supply apparatus includes a trap tank storing the processing solution, a supply line connected to the trap tank to supply the processing solution onto the substrate, a first vent line connected to the trap tank to discharge the processing solution including bubbles or gases from the trap tank, and a first static charge measurement unit connected to the first vent line to measure a static charge of the processing solution, and including a first Faraday cup and a first static charge measurement unit connected to the first Faraday cup.

In some embodiments, the first Faraday cup may include an inner cup accommodating the processing solution supplied from the first vent line, and an outer cup arranged apart from the inner cup by a first separation distance, and the first static charge measurement unit may be configured to apply a ground voltage to the inner cup and apply a Faraday measurement voltage to the outer cup.

In some embodiments, the first static charge measurement unit may be configured to remove static electricity from the processing solution while the processing solution is in contact with the inner cup of the first Faraday cup and the static charge of the processing solution is measured.

In some embodiments, the first vent line may include an inlet line configured to supply the processing solution into the first Faraday cup, and arranged at a first distance from a bottom surface of the inner cup of the first Faraday cup, and a recovery line configured to supply the processing solution of which the static charge is measured from the first Faraday cup onto the substrate, and arranged at a second distance less than the first distance from the bottom surface of the inner cup of the first Faraday cup.

In some embodiments, the processing solution recovered to the trap tank through the recovery line may include a smaller amount of bubbles than the processing solution supplied into the first Faraday cup through the inlet line.

In some embodiments, the first Faraday cup may have an inner space in which an amount of about 50 mL to about 200 mL of the processing solution is stored.

In some embodiments, the processing solution supply apparatus may further include a filter connected to the trap tank by a circulation line to filter out particles in the processing solution, a second vent line connected to the filter to discharge the processing solution including bubbles or gases from the filter, and a second static charge measurement unit connected to the second vent line to measure a static charge of the processing solution, and including a second Faraday cup and a second static charge measurement unit connected to the second Faraday cup.

In some embodiments, the second Faraday cup may include an inner cup accommodating the processing solution supplied from the second vent line, and an outer cup arranged apart from the inner cup by a first distance, and the second static charge measurement unit may be configured to apply a ground voltage to the inner cup and apply a Faraday measurement voltage to the outer cup.

In some embodiments, the processing solution may include a photoresist solution.

According to another aspect of the disclosure, a substrate processing apparatus includes a substrate supporter supporting a substrate, and a processing solution supply apparatus configured to supply a processing solution onto the substrate supported on the substrate supporter. The processing solution supply apparatus includes a trap tank storing the processing solution, a supply line connected to the trap tank to supply the processing solution onto the substrate, a filter connected to the trap tank through a circulation line to receive the processing solution from the trap tank, filter out particles, and recover the filtered processing solution back to the trap tank, a vent line connected to the trap tank or the filter to discharge the processing solution including bubbles or gases from the trap tank or the filter, a static charge measurement unit connected to the vent line and including a Faraday cup configured to measure a static charge of the processing solution, and the Faraday cup includes an inner cup configured to accommodate the processing solution therein and receive a ground voltage, and an outer cup apart from the inner cup and configured to receive a Faraday measurement voltage different from the ground voltage.

In some embodiments, the static charge measurement unit may further include a static charge measurement unit connected to the Faraday cup and configured to apply the ground voltage to the inner cup of the Faraday cup and apply the Faraday measurement voltage to the outer cup of the Faraday cup, and the static charge measurement unit may be configured to remove static electricity from the processing solution while the processing solution is in contact with the inner cup of the Faraday cup and the static charge of the processing solution is measured.

In some embodiments, the vent line may include an inlet line configured to supply the processing solution into the Faraday cup, and arranged at a first distance from a bottom surface of the inner cup of the Faraday cup, and a recovery line configured to supply the processing solution of which the static charge is measured from the Faraday cup onto the substrate, and arranged at a second distance less than the first distance from the bottom surface of the inner cup of the Faraday cup.

In some embodiments, the processing solution may include a photoresist solution, and the Faraday cup may have an inner space in which an amount of about 50 mL to about 200 mL of the processing solution may be stored.

According to another aspect of the disclosure, a substrate processing method includes circulating a processing solution stored in a trap tank via a filter through a circulation line connected to the trap tank, supplying the processing solution to a static charge measurement unit including a Faraday cup through a vent line connected to the trap tank or the filter, measuring a static charge of the processing solution supplied into the Faraday cup and removing static electricity of the processing solution in the Faraday cup, recovering the processing solution of which the static charge has been measured and from which the static electricity has been removed to the trap tank through the vent line, and spraying the processing solution stored in the trap tank onto a substrate supported by a substrate supporter.

In some embodiments, the Faraday cup may include an inner cup accommodating the processing solution therein and an outer cup apart from the inner cup, and the static charge measurement unit may further include a static charge measurement unit connected to the Faraday cup.

In some embodiments, the static charge measurement unit may be configured to apply a ground voltage to the inner cup and apply a Faraday measurement voltage to the outer cup.

In some embodiments, the circulating of the processing solution may be repeatedly performed n times using an initial circulation speed, the substrate processing method further including measuring the static charge after repeatedly performing the circulating of the processing solution n times.

In some embodiments, the substrate processing method may further include adjusting the initial circulation speed of the processing solution or the number of circulation cycles by using the measured static charge.

In some embodiments, the adjusting of the initial circulation speed may include adjusting the initial circulation speed to an adjustment circulation speed when the static charge of the processing solution deviates from a target static charge range.

In some embodiments, after the adjusting of the initial circulation speed to the adjustment circulation speed, the circulating of the processing solution may be repeatedly performed m times using the adjustment circulation speed, the substrate processing method further including measuring the static charge after repeatedly performing the circulating of the processing solution m times.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
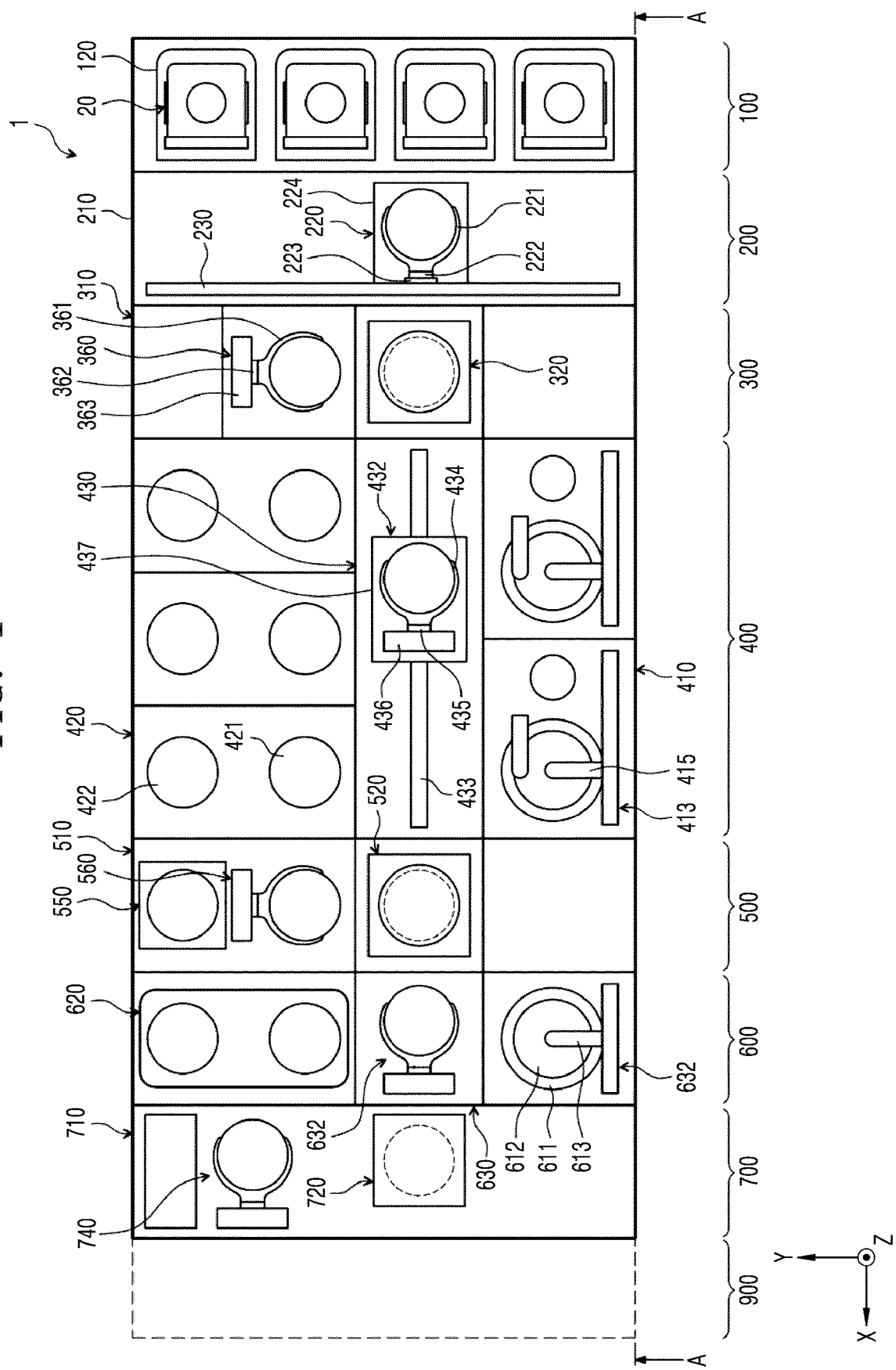
FIG. 1 is a schematic plan view of a substrate processing apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the inventive concept will be described in detail with reference to the accompanying drawings. The same reference numerals are used for the same components in the drawings, and redundant descriptions thereof will be omitted.

Figure 2:
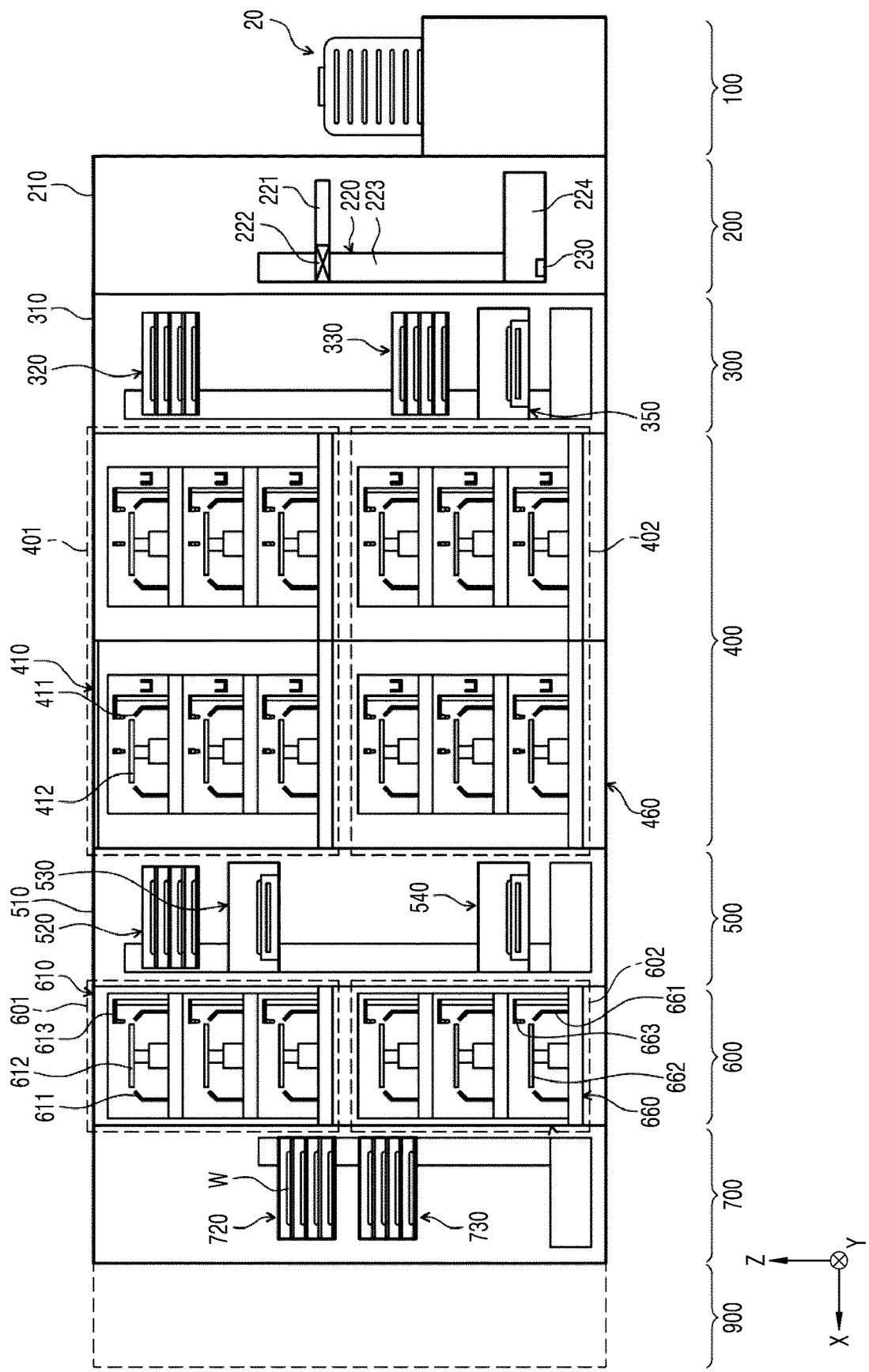
FIG. 2 is a view of the substrate processing apparatus of FIG. 1 when viewed in a A-A direction.

FIG. 1 is a schematic plan view of a substrate processing facility 1 according to an embodiment. FIG. 2 is a schematic view of the substrate processing facility 1 of FIG. 1 when viewed in an A-A direction.

Referring to FIGS. 1 and 2, the substrate processing facility 1 may include a load port 100, an index module 200, a first buffer module 300, a coating and developing module 400, a second buffer module 500, a pre/post-exposure processing module 600, and an interface module 700. The load port 100, the index module 200, the first buffer module 300, the coating and developing module 400, the second buffer module 500, the pre/post-exposure processing module 600, and the interface module 700 are sequentially arranged in a line in one direction.

Hereinafter, a direction in which the load port 100, the index module 200, the first buffer module 300, the coating and developing module 400, the second buffer module 500, the pre/post-exposure processing module 600, and the interface module 700 are arranged is referred to as a first horizontal direction X, a direction perpendicular to the first horizontal direction X when viewed from above is referred to as a second horizontal direction Y, and a direction perpendicular to each of the first horizontal direction X and the second horizontal direction Y is referred to as a vertical direction Z.

A substrate W is moved while being accommodated in a cassette 20. In this regard, the cassette 20 has a structure that may be sealed from the outside. For example, a front open unified pod (FOUP) having a front door may be used as the cassette 20. The load port 100 includes a mounting table 120 on which the cassette 20 in which substrates W are accommodated is placed. The mounting table 120 is provided in plurality, and mounting tables 120 are arranged in a line in the second horizontal direction Y.

The index module 200 transfers the substrate W between the cassette 20 placed on the mounting table 120 of the load port 100 and the first buffer module 300. The index module 200 includes a frame 210, an index robot 220, and a guide rail 230. The frame 210 has a substantially rectangular parallelepiped shape with an empty space therein and is arranged between the load port 100 and the first buffer module 300. The index robot 220 and the guide rail 230 are arranged in the frame 210. The index robot 220 has a structure capable of 4-axis driving such that a hand 221 directly handling the substrate W is movable in the first horizontal direction X, the second horizontal direction Y, and the vertical direction Z and is rotatable. The index robot 220 includes the hand 221, an arm 222, a support 223, and a base 224. The hand 221 is fixedly installed to the arm 222, and the arm 222 is provided in a retractable and rotatable structure and is coupled to the support 223 so as to be movable along the support 223. The support 223 is fixedly coupled to the base 224. The guide rail 230 is provided such that a lengthwise direction thereof is in the second horizontal direction Y, and the base 224 is coupled to the guide rail 230 so as to be rectilinearly movable along the guide rail 230. In addition, although not shown, a door opener for opening/closing a door of the cassette 20 is additionally provided in the frame 210.

The first buffer module 300 includes a frame 310, a first buffer 320, a second buffer 330, a cooling chamber 350, and a first buffer robot 360. The first buffer 320, the second buffer 330, the cooling chamber 350, and the first buffer robot 360 are arranged in the frame 310, and the cooling chamber 350, the second buffer 330, and the first buffer 320 are sequentially arranged in the vertical direction Z from bottom to top. The first buffer 320 is arranged at a height corresponding to a coating module 401 of the coating and developing module 400, and the second buffer 330 and the cooling chamber 350 are arranged at a height corresponding to a developing module 402 of the coating and developing module 400.

Each of the first buffer 320 and the second buffer 330 temporarily stores a plurality of substrates W. The first buffer robot 360 includes a hand 361, an arm 362, and a support 363, and transfers the substrate W between the first buffer 320 and the second buffer 330. The cooling chamber 350 cools the substrate W. The cooling chamber 350 includes a cooling unit, and various methods, such as cooling by cooling water or cooling using a thermoelectric element, may be used for the cooling unit.

The coating and developing module 400 performs a process for coating a photoresist on the substrate W before an exposure process and a process for developing the substrate W after the exposure process. The coating and developing module 400 includes the coating module 401 and the developing module 402. The coating module 401 and the developing module 402 are arranged to be partitioned from each other in different layers. According to an example, the coating module 401 is disposed above the developing module 402.

The coating module 401 performs a process for coating a light-sensitive solution, such as a photoresist, onto the substrate W, and a heat treatment process, such as heating and cooling, on the substrate W before and after the photoresist coating process. The coating module 401 includes a resist coating unit 410, a bake unit 420, and a transfer chamber 430. The resist coating unit 410, the transfer chamber 430, and the bake unit 420 are sequentially arranged in the second horizontal direction Y. The resist coating unit 410 is provided in plurality, and a plurality of resist coating units 410 are provided in each of the first horizontal direction X and the vertical direction Z. A plurality of bake units 420 are provided in each of the first horizontal direction X and the vertical direction Z.

The transfer chamber 430 is arranged parallel to the first buffer 320 of the first buffer module 300 in the first horizontal direction X. A coater robot 432 and a guide rail 433 are arranged in the transfer chamber 430. The coater robot 432 includes a hand 434, an arm 435, a support 436, and a base 437, and transfers the substrate W between bake units 420, resist coating units 410, the first buffer 320 of the first buffer module 300, and a first cooling chamber 520 of the second buffer module 500.

The resist coating units 410 have the same structure. However, the types of light-sensitive solutions used in respective resist coating unit 410 may be different from each other. As an example, a chemical amplification resist may be used as a light-sensitive solution. The resist coating unit 410 coats a light-sensitive solution onto the substrate W. The resist coating unit 410 includes a housing 411, a support plate 412, and a nozzle 413. The housing 411 has a cup shape with an open upper portion. The support plate 412 is arranged in the housing 411 and supports the substrate W. The support plate 412 is rotatably provided. The nozzle 413 supplies a light-sensitive solution onto the substrate W placed on the support plate 412. The nozzle 413 may have a circular tubular shape and may supply a light-sensitive solution to the center of the substrate W. Selectively, the nozzle 413 may have a length corresponding to a diameter of the substrate W, and an outlet of the nozzle 413 may be provided in the form of a slit. In addition, a nozzle 414 for supplying a cleaning solution, such as deionized water, may be additionally provided in the resist coating unit 410 to clean a surface of the substrate W coated with a light-sensitive solution.

The bake unit 420 heat-treats the substrate W. The bake unit 420 heat-treats the substrate W before and after a light-sensitive solution is applied. The bake unit 420 includes a cooling stage 421 and a heating unit 422. The cooling stage 421 cools the substrate W heat-treated by the heating unit 422. The cooling stage 421 has a circular plate shape. A cooling unit, such as cooling water or a thermoelectric element, is provided in the cooling stage 421.

The developing module 402 performs a development process for removing a portion of the photoresist by supplying a developing solution to obtain a pattern on the substrate W, and a heat treatment process, such as heating and cooling, on the substrate W before and after the development process. The developing module 402 includes a developing unit 460, a bake unit (not shown), and a transfer chamber (not shown). The developing unit 460, the transfer chamber, and the bake unit are sequentially arranged in the second horizontal direction Y. The developing unit 460 is provided in plurality, and a plurality of developing units 460 are provided in each of the first horizontal direction X and the vertical direction Z.

The developing units 460 have the same structure. However, the types of developing solutions used in respective developing units 460 may be different from each other. The developing unit 460 removes a light-irradiated region of the photoresist on the substrate W. In this regard, a light-irradiated region of a protective film is also removed. Selectively, only regions to which light is not irradiated among regions of the photoresist and protective film may be removed depending on the type of photoresist used.

The developing unit 460 includes a housing 461, a support plate 462, and a nozzle 463. The housing 461 has a cup shape with an open upper portion. The support plate 462 is arranged in the housing 461 and supports the substrate W. The support plate 462 is rotatably provided. The nozzle 463 supplies a developing solution onto the substrate W placed on the support plate 462. The nozzle 463 may have a circular tubular shape and may supply a developing solution to the center of the substrate W. Selectively, the nozzle 463 may have a length corresponding to a diameter of the substrate W, and an outlet of the nozzle 463 may be provided in the form of a slit. In addition, a nozzle 464 for supplying a cleaning solution, such as deionized water, may be additionally provided in the developing unit 460 to clean a surface of the substrate W onto which a developing solution is supplied.

The bake unit of the developing module 402 heat-treats the substrate W. For example, the bake unit performs a post-bake process for heating the substrate W before a development process is performed, a hard bake process for heating the substrate W after the development process is performed, and a cooling process for cooling the heated substrate W after each of the bake processes. The bake unit of the developing module 402 has the same configuration as that of the bake unit 420 of the coating module 401, and thus detailed description thereof will be omitted.

The transfer chamber of the developing module 402 is arranged parallel to the second buffer 330 of the first buffer module 300 in the first horizontal direction X. A developer robot (not shown) and a guide rail (not shown) are arranged in the transfer chamber, and the developer robot transfers the substrate W between bake units, the developing units 460, the second buffer 330 and cooling chamber 350 of the first buffer module 300, and a second cooling chamber 540 of the second buffer module 500. The transfer chamber of the developing module 402 has the same configuration as that of the transfer chamber 430 of the coating module 401, and thus detailed description thereof will be omitted.

The second buffer module 500 is provided between the coating and developing module 400 and the pre/post-exposure processing module 600, as a passage through which the substrate W is transported. In addition, the second buffer module 500 performs a certain process, such as a cooling process or an edge exposure process, on the substrate W. The second buffer module 500 includes a frame 510, a buffer 520, a first cooling chamber 530, the second cooling chamber 540, an edge exposure chamber 550, and a second buffer robot 560. The buffer 520, the first cooling chamber 530, the second cooling chamber 540, the edge exposure chamber 550, and the second buffer robot 560 are arranged in the frame 510. The buffer 520, the first cooling chamber 530, and the edge exposure chamber 550 are arranged at a height corresponding to the coating module 401. The second cooling chamber 540 is arranged at a height corresponding to the developing module 402. The second buffer robot 560 transports the substrate W between the buffer 520, the first cooling chamber 530, and the edge exposure chamber 550. The second buffer robot 560 may be arranged between the edge exposure chamber 550 and the buffer 520, and may have a structure similar to that of the first buffer robot 360.

The first cooling chamber 530 and the edge exposure chamber 550 perform a subsequent process on the substrates W on which a process has been performed in the coating module 401. The first cooling chamber 530 cools the substrates W on which the process has been performed in the coating module 401, and the edge exposure chamber 550 exposes, to light, edges of the substrates W on which the cooling process has been performed in the first cooling chamber 530. The buffer 520 temporarily stores the substrates W before the substrates W on which the process has been performed in the edge exposure chamber 550 are transported to a pre-processing module 601. The second cooling chamber 540 cools the substrates W before the substrates W on which a process has been performed in a post-processing module 602 are transported to the developing module 402.

When an exposure apparatus 900 performs an immersion lithography process, the pre/post-exposure processing module 600 may process a process for coating a protective film for protecting a photoresist film coated onto the substrate W during immersion exposure. In addition, the pre/post-exposure processing module 600 may perform a process for cleaning the substrate W after exposure. In addition, when a coating process is performed using a chemical amplification resist, the pre/post-exposure processing module 600 may process a post-exposure bake process.

The pre/post-exposure processing module 600 includes the pre-processing module 601 and the post-processing module 602. The pre-processing module 601 performs a process for processing the substrate W before an exposure process is performed, and the post-processing module 602 performs a process for processing the substrate W after the exposure process is performed.

The pre-processing module 601 includes a protective film coating unit 610, a bake unit 620, and a transfer chamber 630. A pre-processing robot 632 is arranged in the transfer chamber 630, and the pre-processing robot 632 transfers the substrate W between protective film coating units 610, bake units 620, the buffer 520 of the second buffer module 500, and a first buffer 720 of the interface module 700.

The protective film coating unit 610 coats a protective film for protecting a resist film onto the substrate W during immersion exposure. The protective film coating unit 610 includes a housing 611, a support plate 612, and a nozzle 613. The nozzle 613 supplies a protective solution for forming a protective film onto the substrate W placed on the support plate 612. The protective solution includes a foamable material. A photoresist and a material having a low affinity with water may be used as the protective solution. For example, the protective solution may include a fluorine-based solvent. The bake unit 620 heat-treats the substrate W coated with the protective film.

The post-processing module 602 includes a cleaning chamber 660, a post-exposure bake unit (not shown), and a transfer chamber (not shown). A post-processing robot (not shown) is arranged in the transfer chamber to transport the substrate W between cleaning chambers 660, post-exposure bake units, the second cooling chamber 540 of the second buffer module 500, and a second buffer 730 of the interface module 700. A post-processing robot 682 provided in the post-processing module 602 may have the same structure as that of the pre-processing robot 632 provided in the pre-processing module 601.

The cleaning chamber 660 cleans the substrate W after an exposure process. The cleaning chamber 660 includes a housing 661, a support plate 662, and a nozzle 663. The housing 661 has a cup shape with an open upper portion. The nozzle 663 supplies a cleaning solution onto the substrate W placed on the support plate 662. Water, such as deionized water, may be used as the cleaning solution. The cleaning chamber 660 supplies a cleaning solution to a central region of the substrate W while rotating the substrate W placed on the support plate 662. A post-exposure bake unit 670 heats the substrate W on which an exposure process has been performed by using far ultraviolet rays.

The interface module 700 transfers the substrate W between the pre/post-exposure processing module 600 and the exposure apparatus 900. The interface module 700 includes a frame 710, the first buffer 720, the second buffer 730, and an interface robot 740. The first buffer 720 is arranged at a height corresponding to the pre-processing module 601, and the second buffer 730 is arranged at a height corresponding to the post-processing module 602. The interface robot 740 is arranged to be apart from the first buffer 720 and the second buffer 730 in the second horizontal direction Y. The interface robot 740 transports the substrate W between the first buffer 720, the second buffer 730, and the exposure apparatus 900. The interface robot 740 has a structure substantially similar to that of the second buffer robot 560.

The first buffer 720 temporarily stores the substrates W before the substrates W on which a process has been performed in the pre-processing module 601 are transferred to the exposure apparatus 900. In addition, the second buffer 730 temporarily stores the substrates W before the substrates W on which a process has been completed in the exposure apparatus 900 are transferred to the post-processing module 602.

Hereinafter, an example of a substrate processing apparatus that processes a substrate by using a processing solution will be described.

Figure 3:
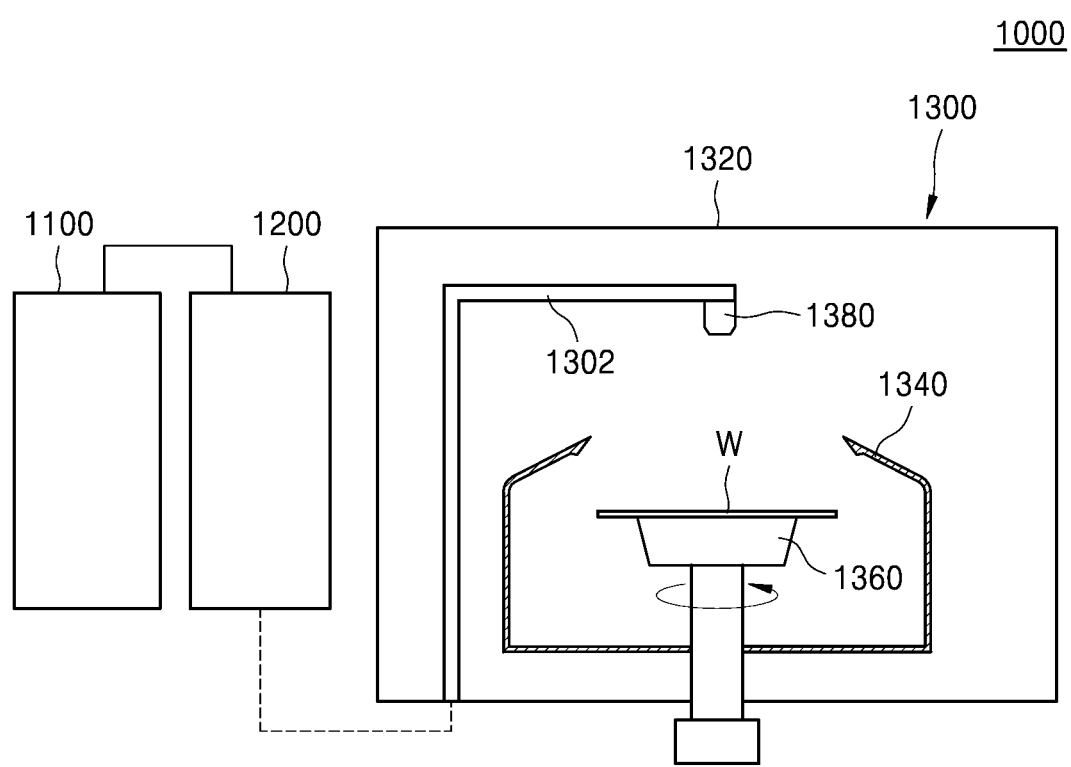
FIG. 3 is a schematic view of a substrate processing apparatus according to an embodiment.
Figure 4:
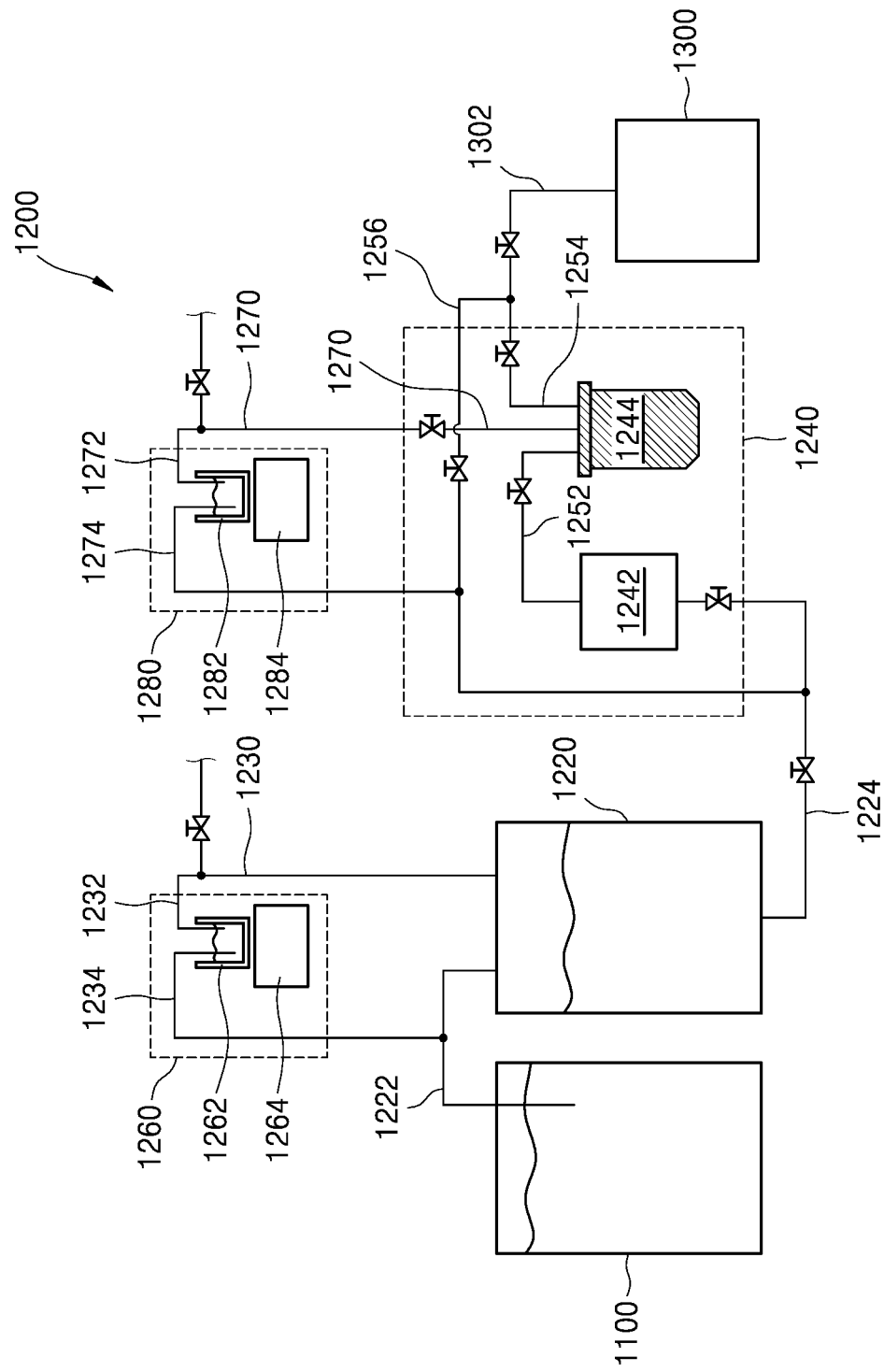
FIG. 4 is a schematic view of a processing solution supply unit of FIG. 3.
Figure 5:
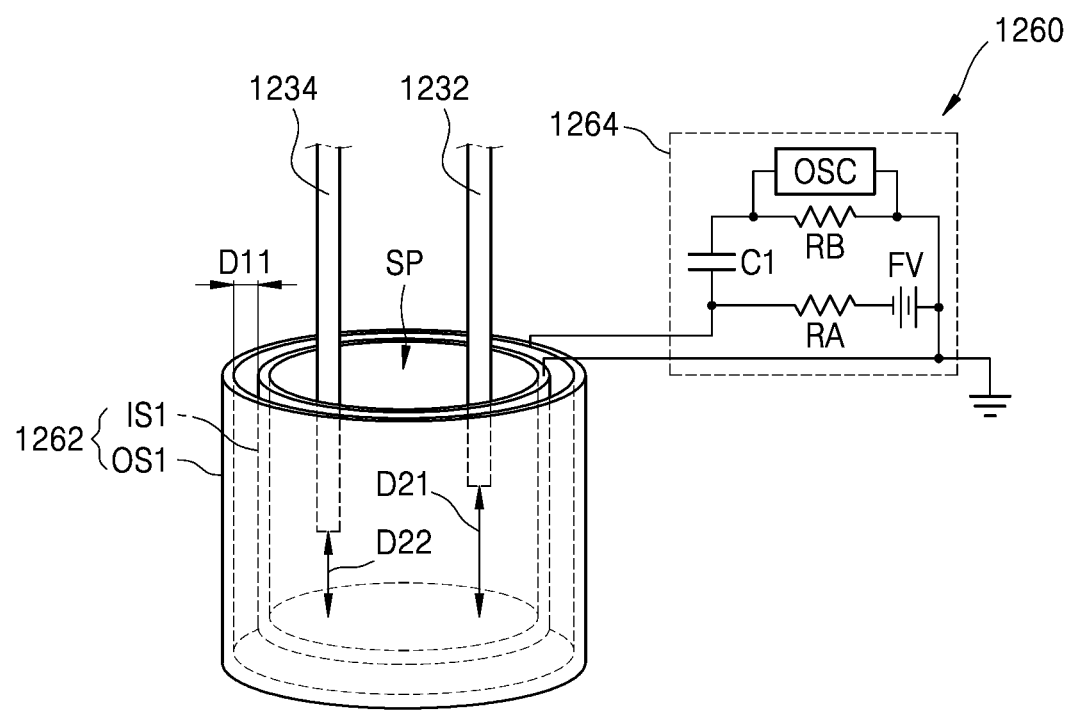
FIG. 5 is a schematic view of a first static charge measurement unit of FIG. 4.

FIG. 3 is a schematic view of a substrate processing apparatus 1000 according to an embodiment. FIG. 4 is a schematic view of a processing solution supply unit 1200 of FIG. 3. FIG. 5 is a schematic view of a first static charge measurement unit 1260 of FIG. 4.

Referring to FIGS. 3 to 5, the substrate processing apparatus 1000 may be configured to supply a processing solution to a substrate. The substrate processing apparatus 1000 may correspond to one of the coating module 401 and the developing module 402, included in the coating and developing module 400, and the pre-processing module 601 and the post-processing module 602, included in the pre/post-exposure processing module 600, described with reference to FIGS. 1 and 2. For example, the substrate processing apparatus 1000 may correspond to one of the resist coating unit 410, the developing unit 460, the protective film coating unit 610, and the cleaning chamber 660, described with reference to FIGS. 1 and 2.

The substrate processing apparatus 1000 may include a processing solution storage tank 1100, the processing solution supply unit 1200, and a processing unit 1300.

The processing solution storage tank 1100 stores a processing solution used for processing the substrate W. The processing solution storage tank 1100 functions as a processing solution supply source. For example, the processing solution may include one of a resist solution used in the resist coating unit 410, a developing solution used in the developing unit 460, a protective solution used in the protective film coating unit 610, and a cleaning solution used in the cleaning chamber 660.

The processing solution supply unit 1200 supplies the processing solution to the processing unit 1300. The processing solution supply unit 1200 may include a trap tank 1220, a filter unit 1240, the first static charge measurement unit 1260, and a second static charge measurement unit 1280. The processing solution supply unit 1200 may further include an inlet line 1222, a circulation line 1224, first and second vent lines 1230 and 1270, and a supply line 1302.

The trap tank 1220 stores the processing solution supplied from the processing solution storage tank 1100.

The inlet line 1222 may connect the processing solution storage tank 1100 and the trap tank 1220 to each other, and may allow the processing solution stored in the processing solution storage tank 1100 to flow into the trap tank 1220.

The circulation line 1224 may be connected to the trap tank 1220 to supply the processing solution stored in the trap tank 1220 to the filter unit 1240. A circulation line valve is connected to the circulation line 1224 such that a flow rate of the processing solution flowing from the trap tank 1220 to the filter unit 1240 may be adjusted.

The first vent line 1230 may be connected to an upper portion of the trap tank 1220 to discharge any solution including bubbles or gases from the processing solution that has flowed into the trap tank 1220. Although not shown, a pressurized gas supply source (not shown) may be additionally connected to the trap tank 1220 to pressurize the processing solution stored in the trap tank 1220. For example, a pressurized gas may be an inert gas or carbon dioxide.

The first static charge measurement unit 1260 may be connected to the first vent line 1230. The first static charge measurement unit 1260 may measure a static charge of the processing solution vented from the trap tank 1220, and simultaneously remove static electricity from the processing solution. The first static charge measurement unit 1260 may include a first Faraday cup 1262 and a first static charge measurement unit 1264.

The first vent line 1230 may include a part for supplying the processing solution into the first Faraday cup 1262 and a part for receiving the processing solution from the first Faraday cup 1262. Of the first vent line 1230, the part for supplying the processing solution into the first Faraday cup 1262 may be referred to as a first inlet line 1232, and the part for receiving the processing solution from the first Faraday cup 1262 may be referred to as a first recovery line 1234.

The first inlet line 1232 may supply the processing solution vented from the trap tank 1220 to the first Faraday cup 1262. The first recovery line 1234 may supply the processing solution from the first Faraday cup 1262 back to the trap tank 1220. In other words, the processing solution may be supplied from the trap tank 1220 to the first Faraday cup 1262 through the first vent line 1230, that is, through the first inlet line 1232, a static charge of the processing solution may be measured in the first Faraday cup 1262, and the processing solution from which static electricity has been removed by the first Faraday cup 1262 may flow back into the trap tank 1220 through the first recovery line 1234.

The filter unit 1240 may be connected to the trap tank 1220 by the circulation line 1224. The processing solution of which the static charge has been measured and from which the static electricity has been removed using the first static charge measurement unit 1260 may be supplied from the trap tank 1220 to the filter unit 1240 through the circulation line 1224. The circulation line 1224 may circulate the processing solution stored in the trap tank 1220, and the supply line 1302 may be branched from the circulation line 1224 through the filter unit 1240 to supply the processing solution from the trap tank 1220 to each processing unit 1300.

The filter unit 1240 may filter fine particles or particles inside the processing solution. The filter unit 1240 may include a pump 1242, a filter 1244, a filter inlet line 1252, a filter outlet line 1254, and a filter recovery line 1256.

The pump 1242 may receive the processing solution from the trap tank 1220 through the circulation line 1224. The filter inlet line 1252 is connected to the pump 1242, and the filter inlet line 1252 is connected to an inlet port of the filter 1244, such that the processing solution is supplied from the pump 1242 into the filter 1244. The filter outlet line 1254 is connected to the filter 1244 such that the processing solution from which the fine particles or the particles have been filtered out in the filter 1244 passes through an outlet port of the filter 1244 and is discharged through the filter outlet line 1254. The filter outlet line 1254 may be connected to the supply line 1302, and the processing solution from which the fine particles or the particles have been filtered out may be supplied to the processing unit 1300 through the supply line 1302. The filter recovery line 1256 may be branched from the filter outlet line 1254, and the filter recovery line 1256 may be connected to the circulation line 1224, such that the processing solution from which the fine particles or the particles have been filtered out may be discharged from the outlet port of the filter 1244 and supplied to the trap tank 1220 through the filter recovery line 1256 (for example, the processing solution may be circulated along first to third circulation paths CP1, CP2, and CP3 shown in FIG. 7).

The second vent line 1270 may be additionally connected to the filter 1244. The second vent line 1270 may discharge any solution including bubbles or gases from the processing solution that has flowed into the filter 1244.

The second static charge measurement unit 1280 may be connected to the second vent line 1270. The second static charge measurement unit 1280 may measure a static charge of the processing solution vented from the filter 1244 through the second vent line 1270, and simultaneously remove static electricity from the processing solution. The second static charge measurement unit 1280 may include a second Faraday cup 1282 and a second static charge measurement unit 1284.

The second vent line 1270 may include a part for supplying the processing solution into the second Faraday cup 1282 and a part for receiving the processing solution from the second Faraday cup 1282. Of the second vent line 1270, the part for supplying the processing solution into the second Faraday cup 1282 may be referred to as a second inlet line 1272, and the part for receiving the processing solution from the second Faraday cup 1282 may be referred to as a second recovery line 1274.

The second inlet line 1272 may supply the processing solution vented from the filter 1244 to the second Faraday cup 1282. The second recovery line 1274 may supply the processing solution from the second Faraday cup 1282 to the trap tank 1220 through the filter recovery line 1256 and the circulation line 1224. In other words, the processing solution may be supplied from the filter 1244 to the second Faraday cup 1282 through the second vent line 1270, that is, through the second inlet line 1272, a static charge of the processing solution may be measured in the second Faraday cup 1282, and the processing solution from which static electricity has been removed by the second Faraday cup 1282 may flow back into the trap tank 1220 via the filter recovery line 1256 and the circulation line 1224 through the second recovery line 1274.

FIG. 4 exemplarily shows that a valve is installed on each of the circulation line 1224, the first vent line 1230, the filter inlet line 1252, the filter outlet line 1254, the filter recovery line 1256, the second vent line 1270, the filter inlet line 1252, and the supply line 1302. However, the arrangement of the valve is not limited to that illustrated in FIG. 4. The valve may include various types, such as a needle valve, a constant pressure valve, and a diaphragm valve.

The processing unit 1300 may include a housing 1320, a cup 1340, a substrate supporter 1360, and a nozzle 1380.

The housing 1320 has a substantially rectangular parallelepiped shape. The cup 1340, the substrate supporter 1360, the supply line 1302, and the nozzle 1380 are arranged in the housing 1320.

The cup 1340 may have a processing space of which an upper portion is open, and the substrate W may be processed in the cup 1340. The substrate supporter 1360 may be arranged in the cup 1340, and the substrate W may be mounted on the substrate supporter 1360. A lift unit (not shown) may be additionally connected to the substrate supporter 1360 such that a relative height between the cup 1340 and the substrate supporter 1360 may be adjusted, and the substrate supporter 1360 may rotate at a certain speed during processing. Although not shown, a plurality of recovery spaces may be installed in the cup 1340 such that the processing solution scattered by rotation of the substrate W may flow into the plurality of recovery spaces.

The supply line 1302 may be connected to the inside of the housing 1320, and the nozzle 1380 may be installed at an end of the supply line 1302. The processing solution may be sprayed onto the substrate W from the supply line 1302 through the nozzle 1380.

Hereinafter, the configuration of the first static charge measurement unit 1260 will be described in detail with reference to FIG. 5. Although FIG. 5 illustrates only the first static charge measurement unit 1260, the configuration of the second static charge measurement unit 1280 may be similar to that of the first static charge measurement unit 1260.

As described above, the first static charge measurement unit 1260 may include the first Faraday cup 1262 and the first static charge measurement unit 1264. The first static charge measurement unit 1264 may be electrically connected to the first Faraday cup 1262 such that a static charge of the processing solution supplied into the first Faraday cup 1262 may be measured, and simultaneously static electricity may be removed from the processing solution.

The first Faraday cup 1262 may include an inner cup IS1 and an outer cup OS1. The inner cup IS1 and the outer cup OS1 may be arranged apart from each other by a first separation distance D11. For example, each of the inner cup IS1 and the outer cup OS1 may have a cup shape with a closed bottom and an open top, the inner cup IS1 may be arranged apart from the outer cup OS1 inside the outer cup OS1, and the outer cup OS1 may surround the inner cup IS1. A separation space may be provided between the inner cup IS1 and the outer cup OS1, and accordingly, the inner cup IS1 and the outer cup OS1 may not be physically and electrically connected to each other (for example, different voltages may be applied to the inner cup IS1 and the outer cup OS1).

The inner cup IS1 may have an inner space SP having a volume suitable for accommodating the processing solution vented from the trap tank 1220. For example, when the processing solution includes a photoresist solution, the inner space SP of the inner cup IS1 may have a volume that may accommodate about 50 mL to about 200 mL of the processing solution. When the processing solution includes other types of solutions, a volume of the inner space SP of the inner cup IS1 may vary appropriately.

The first static charge measurement unit 1264 may have a circuit configuration electrically connected to the inner cup IS1 and the outer cup OS1 so as to apply different voltages to the inner cup IS1 and the outer cup OS1, respectively. According to an example of the first static charge measurement unit 1264 shown in FIG. 5, the inner cup IS1 may be grounded, and a Faraday measurement voltage may be applied to the outer cup OS1.

The Faraday measurement voltage may be determined from a circuit configuration in which an oscillator OSC, a capacitor C1, and a bias voltage FV are connected to the outer cup OS1 as shown in FIG. 5. For example, a circuit configuration in which a first circuit component and a second circuit component are connected to each other in parallel may be connected to the outer cup OS1, a first resistance component RA which is relatively larger and the bias voltage FV may be connected in series in the first circuit component, the oscillator OSC and the capacitor C1 are connected in series in the second circuit component connected to the first circuit component in parallel, and a relatively small second resistance component RB may be connected to the oscillator OSC in parallel. For example, the capacitor C1 may be about 10 nF to about 200 nF, the first resistance component RA may be about 500 kΩ to about 2 MΩ, and the second resistance component RB may be about 10Ω to about 100Ω, but the disclosure is not limited thereto.

The first Faraday cup 1262 may be electrically connected to the first static charge measurement unit 1264, and may be configured to measure a static charge of the processing solution supplied into the first Faraday cup 1262. For example, when the processing solution is circulated using the filter unit 1240 to remove fine particles or particles in the processing solution, friction may occur between a pipe line and the processing solution, and electrostatic charge may be generated in the processing solution due to the friction. During the circulation process, the first Faraday cup 1262 may measure an amount of frictional static charge between the pipe line and the processing solution by measuring a static charge of the processing solution based on the processing solution vented from the trap tank 1220. In addition, in the first Faraday cup 1262, the static charge may be measured, and simultaneously, electrostatic charge of the processing solution may be removed by contact between the inner cup IS1 of the first Faraday cup 1262 and the processing solution.

As shown in FIG. 5, the first inlet line 1232, which supplies the processing solution into the first Faraday cup 1262, may be arranged at a first distance D21 from a bottom surface of the inner cup IS1, and the first recovery line 1234, which discharges the processing solution from the first Faraday cup 1262, may be arranged at a second distance D22 from the bottom surface of the inner cup IS1. The second distance D22 may be less than the first distance D21. When the processing solution falls from the first inlet line 1232 into the inner cup IS1, bubbles or gases present in the processing solution may aggregate or combine together and rise to the top of the processing solution to float, and accordingly, the bubbles or the gases may be easily removed from the processing solution. The processing solution of which the static charge has been measured and from which the static electricity has been removed may be discharged to the trap tank 1220 through the first recovery line 1234 and reused.

According to the embodiments described above, while a static charge of the processing solution is measured by supplying the processing solution into the first and second Faraday cups 1262 and 1282 through the first and second vent lines 1230 and 1270 connected to the trap tank 1220 or the filter 1244, electrostatic charge may be removed from the processing solution. In addition, the static charge of the processing solution may be measured using the first and second Faraday cups 1262 and 1282, and a circulation speed of the processing solution or the number of circulation cycles may be adjusted based on the measured static charge. Therefore, the static charge of the processing solution sprayed onto the substrate W may be reduced, and a yield of the substrate processing apparatus 1000 may increase.

In FIGS. 3 to 5, a configuration in which the first static charge measurement unit 1260 is connected to the first vent line 1230 connected to the trap tank 1220, and the second static charge measurement unit 1280 is connected to the second vent line 1270 connected to the filter unit 1240 has been described as an example. Accordingly, the processing solution from which static electricity and bubbles are removed may be supplied from the first static charge measurement unit 1260 to the trap tank 1220, and the processing solution from which static electricity and bubbles are removed may be supplied from the second static charge measurement unit 1280 to the trap tank 1220, to reduce static electricity of the processing solution. However, the disclosure is not limited thereto, and in some embodiments, one of the first static charge measurement unit 1260 and the second static charge measurement unit 1280 may be omitted. In some embodiments, an additional static charge measurement unit may be installed in one of the trap tank 1220 and the filter unit 1240.

According to some embodiments, the substrate processing apparatus 1000 may further include a controller. The controller may be implemented by hardware, firmware, software, or any combination thereof. For example, the controller may include a computing apparatus, such as a workstation computer, a desktop computer, a laptop computer, a tablet computer. The controller may include a simple controller, a complex processor such as a microprocessor, a central processing unit (CPU), and a graphics processing unit (GPU), a processor configured by software, dedicated hardware, or firmware. The controller may be implemented by, for example, a general-purpose computer or application-specific hardware, such as a digital signal processor (DSP), a field-programmable gate array (FPGA), and an application-specific integrated circuit (ASIC).

Firmware, software, routines, or instructions may be configured to perform the operations described above with respect to the controller or any process described below. For example, the controller may be implemented by software configured to generate signals for controlling circulation of the processing solution and measurement of a static charge thereof in the processing solution supply unit 1200. The operations of the controller may result from a computing apparatus, a processor, and other apparatuses executing firmware, software, routines, and instructions.

According to some embodiments, the substrate processing apparatus 1000 may include an Ethernet for control automation technology (EtherCAT) network for communication with an external server.

Figure 6:
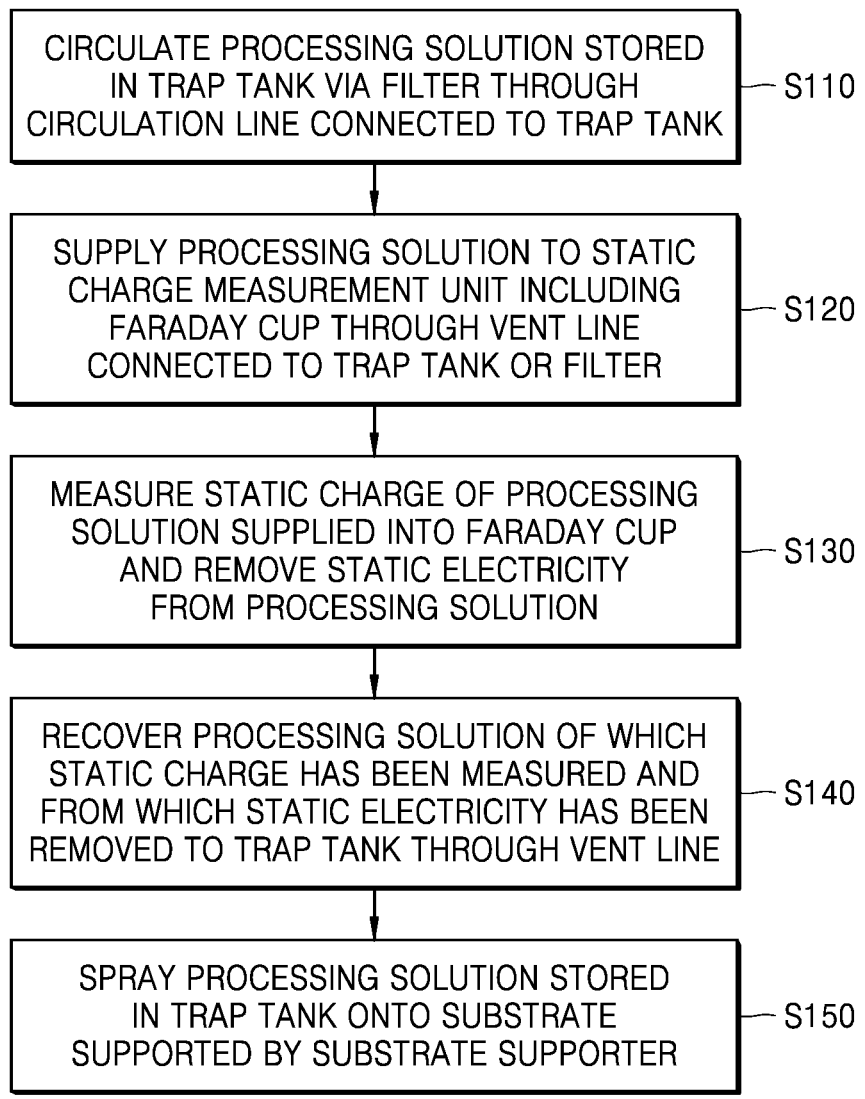
FIG. 6 is a flow chart of a substrate processing method according to some embodiment.
Figure 7:
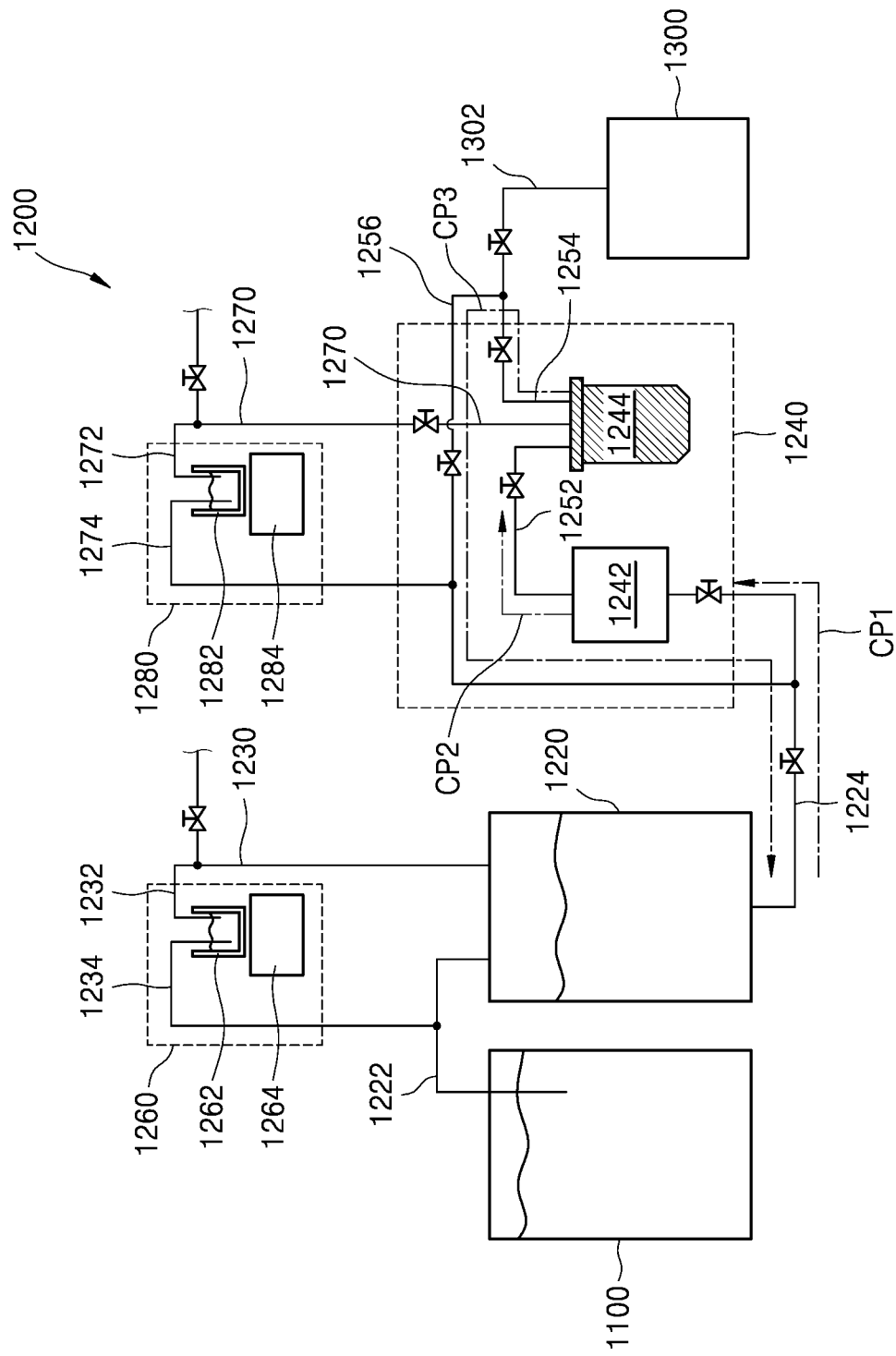
FIGS. 7 and 8 are schematic views exemplarily showing how a processing solution is circulated in a processing solution supply unit.
Figure 8:
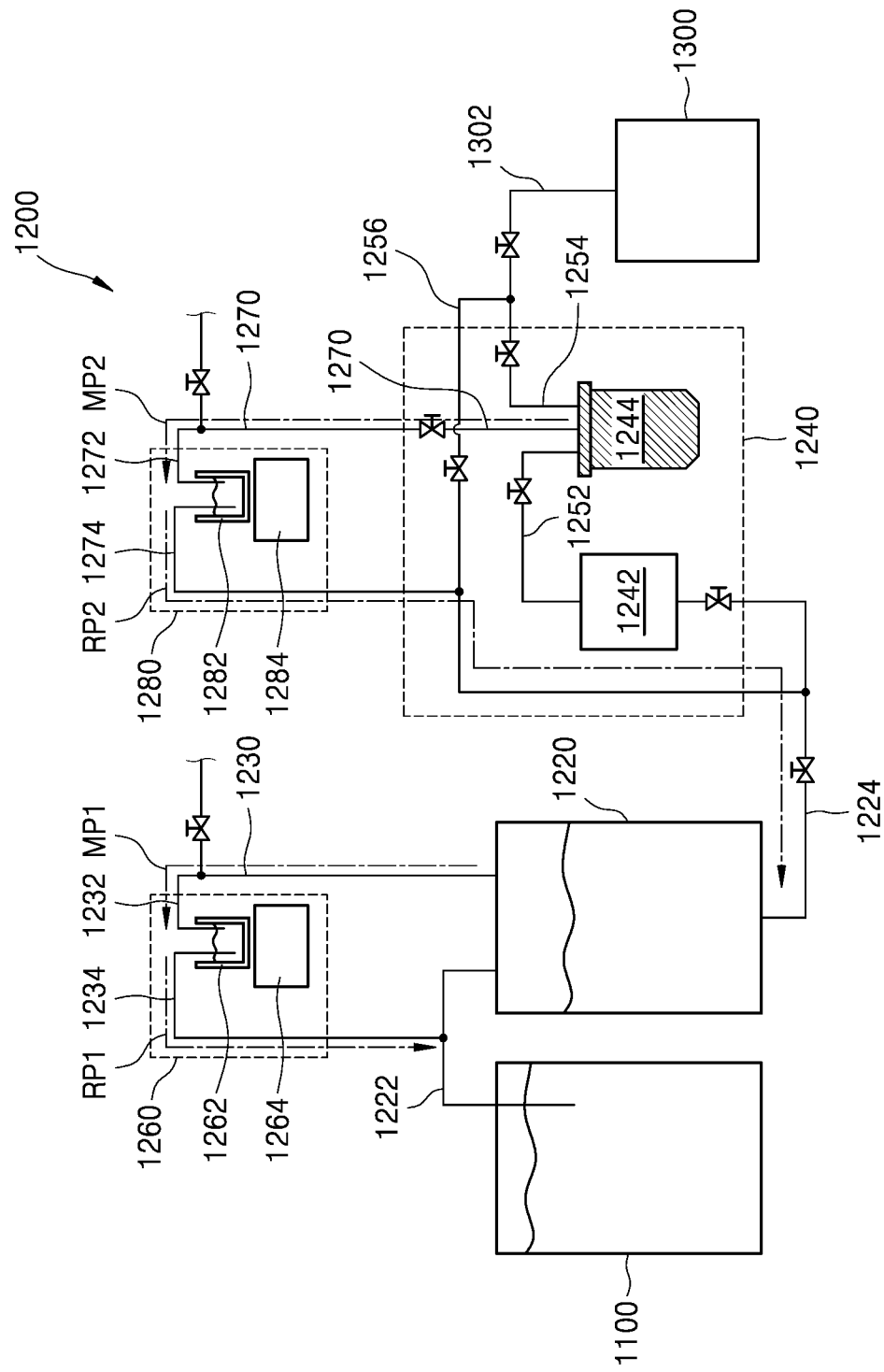

FIG. 6 is a flow chart of a substrate processing method according to some embodiment. FIGS. 7 and 8 are schematic views exemplarily showing how the processing solution is circulated in the processing solution supply unit 1200. In FIGS. 6 to 8, a substrate processing method using the substrate processing apparatus 1000 described with reference to FIGS. 3 to 5 is described as an example.

Referring to FIGS. 6 and 7, the processing solution stored in the trap tank 1220 may be circulated via the filter 1244 through the circulation line 1224 connected to the trap tank 1220 (operation S110).

In some embodiments, the processing solution stored in the trap tank 1220 may be sucked into the pump 1242 through the circulation line 1224 along the first circulation path CP1. The processing solution may flow into the filter 1244 from the pump 1242 through the filter inlet line 1252 along the second circulation path CP2, and fine particles or particles included in the processing solution may be filtered out in the filter 1244. The processing solution discharged from the filter 1244 through the filter outlet line 1254 may be flow back into the trap tank 1220 through the filter recovery line 1256 along the third circulation path CP3.

The circulation of the processing solution along the first to third circulation paths CP1, CP2, and CP3 may be referred to as a circulation cycle. In some embodiments, the circulating of the processing solution may be repeated to perform a plurality of circulation cycles. For example, the circulating of the processing solution may include performing a circulation cycle n times.

The circulating of the processing solution may be performed by flowing the processing solution at a certain circulation speed. For example, a circulation speed of the processing solution may be determined by an amount of fine particles or particles in the processing solution, physical properties of the processing solution, or the like.

Referring to FIGS. 6 and 8, the processing solution may be supplied to the first static charge measurement unit 1260 including the first Faraday cup 1262 through the first vent line 1230 connected to the trap tank 1220 or the filter 1244, and may be supplied to the second static charge measurement unit 1280 including the second Faraday cup 1282 through the second vent line 1270 connected to the trap tank 1220 or the filter 1244 (operation S120).

In some embodiments, the processing solution stored in the trap tank 1220 may flow into the first Faraday cup 1262 of the first static charge measurement unit 1260 through the first vent line 1230 along a first measurement path MP1. For example, the processing solution vented through the first vent line 1230 may be processing solution including bubbles or gases therein.

In addition, the processing solution that has passed through the filter 1244 may flow into the second Faraday cup 1282 of the second static charge measurement unit 1280 through the second vent line 1270 along a second measurement path MP2. For example, the processing solution vented from the filter 1244 through the second vent line 1270 may be processing solution including bubbles or gases therein.

In some embodiments, the supplying of the processing solution to the first static charge measurement unit 1260 including the first Faraday cup 1262 through the first vent line 1230 and the supplying of the processing solution to the second static charge measurement unit 1280 including the second Faraday cup 1282 through the second vent line 1270 may be repeatedly performed after a plurality of circulation cycles. For example, the processing solution may be vented through the first and second vent lines 1230 and 1270 after 5 to 100 circulation cycles. In some embodiments, the processing solution may be vented through the first and second vent lines 1230 and 1270 every five circulation cycles. In some embodiments, the processing solution may be vented through the first and second vent lines 1230 and 1270 every 20 circulation cycles.

Afterwards, a static charge of the processing solution supplied into the first and second Faraday cups 1262 and 1282 may be measured, and static electricity of the processing solution may be removed (operation S130).

In some embodiments, each of the first and second Faraday cups 1262 and 1282 may include the inner cup IS1 and the outer cup OS1 as described with reference to FIG. 5, and the inner cup IS1 and the outer cup OS1 may be arranged apart by the first separation distance D11. The first static charge measurement unit 1264 may be electrically connected to the inner cup IS1 and the outer cup OS1, and may be configured to measure a static charge of the processing solution supplied into the first Faraday cup 1262, and the second static charge measurement unit 1284 may be electrically connected to the inner cup IS1 and the outer cup OS1, and may be configured to measure a static charge of the processing solution supplied into the second Faraday cup 1282. For example, each of the first and second static charge measurement units 1264 and 1284 may be configured to apply a ground voltage to the inner cup IS1 and apply a Faraday measurement voltage to the outer cup OS1, and accordingly, a static charge of the processing solution may be measured.

For example, when the processing solution is circulated using the filter unit 1240 to remove fine particles or particles in the processing solution, friction may occur between a pipe line and the processing solution, and electrostatic charge may be generated in the processing solution due to the friction. Each of the first and second Faraday cups 1262 and 1282 may measure an amount of frictional static charge between the pipe line and the processing solution by this circulation process by measuring a static charge of the processing solution by using the processing solution vented from the trap tank 1220.

In addition, in the first Faraday cup 1262, the static charge may be measured, and simultaneously, electrostatic charge of the processing solution may be removed by contact between the inner cup IS1 of the first Faraday cup 1262 and the processing solution, and in the second Faraday cup 1282, the static charge may be measured, and simultaneously, electrostatic charge of the processing solution may be removed by contact between the inner cup IS1 of the second Faraday cup 1282 and the processing solution.

In addition, as shown in FIG. 5, the first and second inlet lines 1232 and 1272, which supply the processing solution into the first and second Faraday cups 1262 and 1282, respectively, may each be arranged at the first distance D21 from the bottom surface of the inner cup IS1, and the first and second recovery lines 1234 and 1274, which discharge the processing solution from the first and second Faraday cups 1262 and 1282, respectively, may each be arranged at the second distance D22 from the bottom surface of the inner cup IS1, wherein the second distance D22 may be less than the first distance D21. When the processing solution is supplied from each of the first and second inlet lines 1232 and 1272 into the inner cup IS1, bubbles or gases present in the processing solution may aggregate or combine together and rise to the top of the processing solution to float, and accordingly, the bubbles or the gases may be easily removed from the processing solution.

Afterwards, the processing solution of which the static charge has been measured and from which the static electricity has been removed may be recovered to the trap tank 1220 through the first and second vent lines 1230 and 1270 (operation S140).

In some embodiments, the processing solution of which the static charge has been measured and from which the static electricity has been removed may flow into the trap tank 1220 from the first Faraday cup 1262 through the first vent line 1230, for example, through the first recovery line 1234, along a first recovery path RP1. For example, the processing solution flowing into the trap tank 1220 along the first recovery path RP1 may be processing solution in which static electricity is reduced and from which bubbles are removed.

In addition, the processing solution of which the static charge has been measured and from which the static electricity has been removed may flow into the trap tank 1220 from the second Faraday cup 1282 through the second vent line 1270, for example, through the second recovery line 1274, along a second recovery path RP2. For example, the processing solution flowing into the trap tank 1220 along the second recovery path RP2 may be processing solution in which static electricity is reduced and from which bubbles are removed.

Afterwards, the processing solution stored in the trap tank 1220 may be sprayed onto the substrate W supported by the substrate supporter 1360 (operation S150).

In some embodiments, the processing solution may be sprayed onto the substrate W through the nozzle 1380 via the supply line 1302 through the filter unit 1240 from the trap tank 1220 to supply the processing solution stored in the trap tank 1220 to the processing unit 1300.

According to some embodiments, since the first and second static charge measurement units 1260 and 1280 may not only measure a static charge of the processing solution but also remove static electricity from the processing solution, static electricity of the processing solution sprayed onto the substrate W through the nozzle 1380 may be removed.

For example, in a case where the processing solution includes a photoresist solution, when the processing solution is electrostatically charged by friction, physical properties of a photoresist material formed on the substrate W may be adversely affected. For example, electrostatic charge in the processing solution may cause dielectric breakdown of a photoresist pattern formed in a relatively fine pattern, which may adversely affect performance and yield of semiconductor devices formed on the substrate W in a subsequent process.

However, in the embodiments described above, since the first and second static charge measurement units 1260 and 1280 not only measure a static charge of the processing solution but also remove static electricity from the processing solution, a yield of a substrate processing process may increase.

Figure 9:
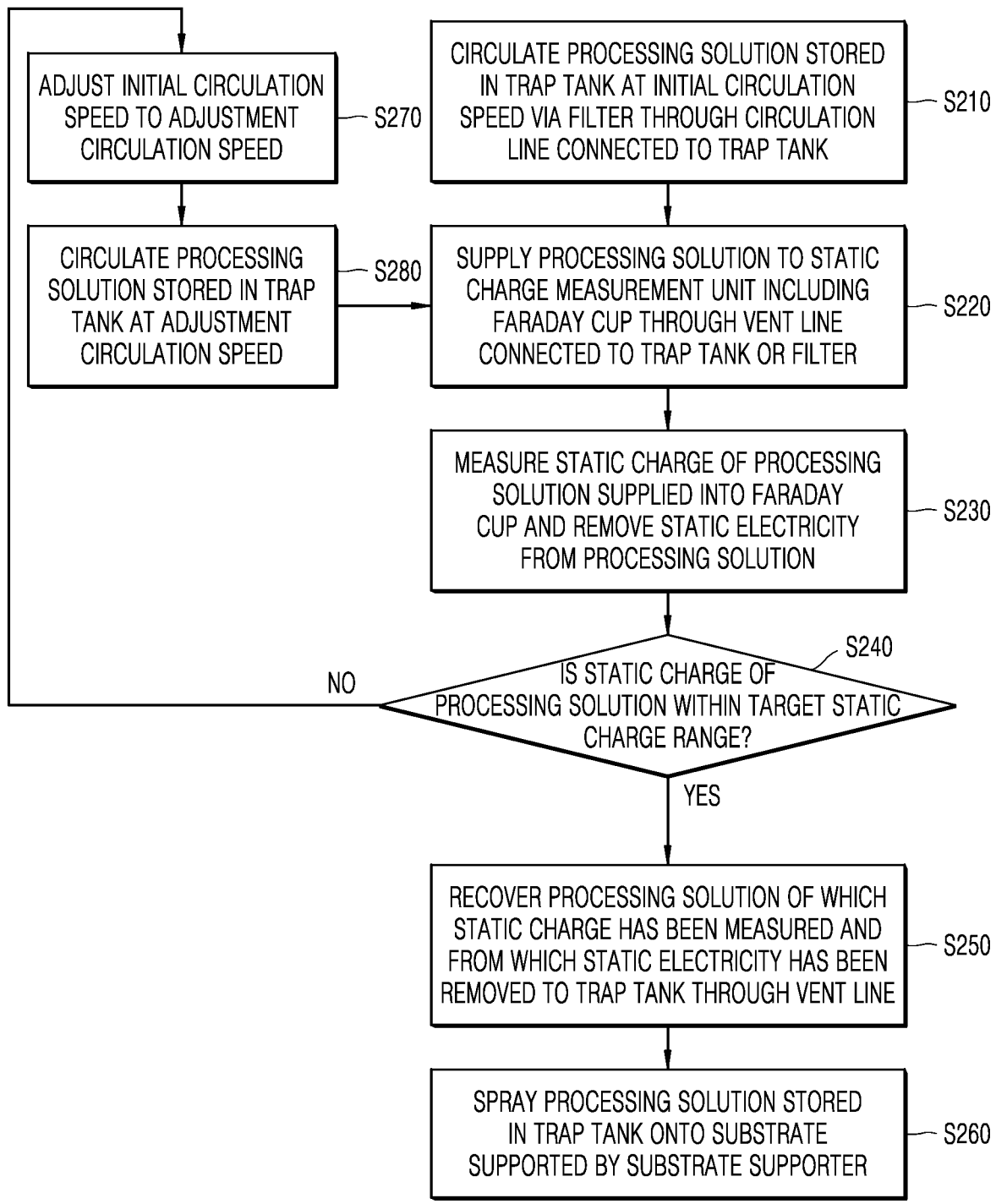
FIG. 9 is a flow chart of a substrate processing method according to some embodiments.

FIG. 9 is a flow chart of a substrate processing method according to some embodiments.

Referring to FIG. 9 together with FIG. 7, the processing solution stored in the trap tank 1220 may be circulated at an initial circulation speed via the filter 1244 through the circulation line 1224 connected to the trap tank 1220 (operation S210).

In some embodiments, the circulating of the processing solution may be repeatedly performed n times using the initial circulation speed.

In some embodiments, the initial circulation speed may mean an amount of the processing solution flowing through a circulation line during one circulation cycle. For example, the initial circulation speed may refer to a flow rate of the processing solution flowing through a circulation line per unit time. In this case, the initial circulation speed may correspond to the number of times the circulation cycle is performed for a certain period of time. For example, when the initial circulation speed is 10, 10 circulation cycles are performed during a unit process time.

In some embodiments, the initial circulation speed may refer to the number of times the circulation cycle is performed before a venting operation and a static charge measurement operation are performed. For example, when the initial circulation speed is 10, 10 circulation cycles are performed before the venting operation is performed. In other words, after every 10 circulation cycles, venting of the processing solution through the first and second vent lines 1230 and 1270 may be performed.

Referring to FIG. 9 together with FIG. 8, the processing solution may be supplied to the first static charge measurement unit 1260 including the first Faraday cup 1262 through the first vent line 1230 connected to the trap tank 1220 or the filter 1244, and may be supplied to the second static charge measurement unit 1280 including the second Faraday cup 1282 through the second vent line 1270 connected to the trap tank 1220 or the filter 1244 (operation S220).

In some embodiments, the processing solution stored in the trap tank 1220 may flow into the first Faraday cup 1262 of the first static charge measurement unit 1260 through the first vent line 1230 along a first measurement path MP1. For example, the processing solution vented through the first vent line 1230 may be processing solution including bubbles or gases therein.

In addition, the processing solution that has passed through the filter 1244 may flow into the second Faraday cup 1282 of the second static charge measurement unit 1280 through the second vent line 1270 along a second measurement path MP2. For example, the processing solution vented from the filter 1244 through the second vent line 1270 may be processing solution including bubbles or gases therein.

Afterwards, a static charge of the processing solution supplied into the first and second Faraday cups 1262 and 1282 may be measured, and static electricity of the processing solution may be removed (operation S230).

In some embodiments, each of the first and second Faraday cups 1262 and 1282 may include the inner cup IS1 and the outer cup OS1 as described with reference to FIG. 5, and the inner cup IS1 and the outer cup OS1 may be arranged apart by the first separation distance D11. The first static charge measurement unit 1264 may be electrically connected to the inner cup IS1 and the outer cup OS1, and may be configured to measure a static charge of the processing solution supplied into the first Faraday cup 1262, and the second static charge measurement unit 1284 may be electrically connected to the inner cup IS1 and the outer cup OS1, and may be configured to measure a static charge of the processing solution supplied into the second Faraday cup 1282. For example, each of the first and second static charge measurement units 1264 and 1284 may be configured to apply a ground voltage to the inner cup IS1 and apply a Faraday measurement voltage to the outer cup OS1, and accordingly, a static charge of the processing solution may be measured.

Afterwards, whether the measured static charge of the processing solution is within a target static charge range may be determined in operation S240 (operation S240).

For example, the target static charge range may be predetermined based on a defect occurrence rate or yield obtained by the processing solution sprayed or coated onto the substrate W in a subsequent process. When the processing solution is circulated using the filter unit 1240 to remove fine particles or particles in the processing solution, friction may occur between a pipe line and the processing solution, and electrostatic charge may be generated in the processing solution due to the friction. For example, when the number of circulation cycles is relatively large, generation of electrostatic charge due to friction increases, and thus dielectric breakdown of a photoresist pattern on the substrate W may occur. In contrast, when the number of circulation cycles is relatively small, fine particles or particles in the processing solution are not sufficiently removed, and thus contaminants or particulates of a photoresist pattern on the substrate W may be generated. Accordingly, a target static charge range may be determined by a trade-off relationship between the effect of electrostatic charge and the effect of fine particles or particles.

If the measured static charge is within the target static charge range, the processing solution of which the static charge has been measured and from which the static electricity has been removed may be recovered to the trap tank through the vent line (operation S250).

Afterwards, the processing solution stored in the trap tank may be sprayed onto the substrate supported by the substrate supporter (operation S260).

If the static charge of the processing solution, measured in operation S240, deviates from the target static charge range, the initial circulation speed may be adjusted to an adjustment circulation speed (operation S270).

In some embodiments, when the measured static charge of the processing solution is greater than the upper limit of the target static charge range, the adjustment circulation speed may decrease from the initial circulation speed. In contrast, when the measured static charge of the processing solution is smaller than the upper limit of the target static charge range, the adjustment circulation speed may increase from the initial circulation speed.

In some embodiments, the adjusting of the initial circulation speed to the adjustment circulation speed may include adjusting the initial circulation speed of the processing solution or the number of circulation cycles. For example, when the measured static charge of the processing solution is greater than the upper limit of the target static charge range, the adjustment circulation speed may decrease from the initial circulation speed. For example, when the measured static charge of the processing solution is greater than the upper limit of the target static charge range, a flow rate of the processing solution (i.e., a flow velocity of the processing solution) per unit time may decrease, or the number of circulation cycles of the processing solution may decrease. In contrast, when the measured static charge of the processing solution is smaller than the upper limit of the target static charge range, the adjustment circulation speed may increase from the initial circulation speed. For example, when the measured static charge of the processing solution is smaller than the upper limit of the target static charge range, a flow rate of the processing solution (i.e., a flow velocity of the processing solution) per unit time may increase, or the number of circulation cycles of the processing solution may increase.

Afterwards, the processing solution may be circulated from the trap tank 1220 at the adjustment circulation speed (operation S280).

In some embodiments, the circulating of the processing solution may be repeatedly performed m times using the adjustment circulation speed. For example, in the circulating of the processing solution, after m circulation cycles are performed, the static charge may be measured.

According to the embodiments described above, a static charge of the processing solution is measured by the first and second static charge measurement units 1260 and 1280, and when the measured static charge deviates a target static charge range, a circulation speed may be adjusted or the number of circulation cycles may be adjusted. Accordingly, generation of frictional static charge may be minimized, and simultaneously, fine particles or particles in the processing solution may be removed, and thus a yield of a substrate processing process may increase.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
   a substrate supporter supporting a substrate; and
   a processing solution supply apparatus configured to supply a processing solution onto the substrate supported on the substrate supporter,
   wherein the processing solution supply apparatus comprises:
   a trap tank storing the processing solution;
   a supply line connected to the trap tank to supply the processing solution onto the substrate;
   a first vent line connected to the trap tank to discharge the processing solution including bubbles or gases from the trap tank; and
   a first static charge measurement unit connected to the first vent line to measure a static charge of the processing solution, and comprising a first Faraday cup and a first static charge measurement unit connected to the first Faraday cup.

2. The substrate processing apparatus of claim 1, wherein the first Faraday cup comprises:
   an inner cup accommodating the processing solution supplied from the first vent line; and
   an outer cup arranged apart from the inner cup by a first separation distance, and
   the first static charge measurement unit is configured to apply a ground voltage to the inner cup and apply a Faraday measurement voltage to the outer cup.

3. The substrate processing apparatus of claim 2, wherein the first static charge measurement unit is configured to remove static electricity from the processing solution while the processing solution is in contact with the inner cup of the first Faraday cup and the static charge of the processing solution is measured.

4. The substrate processing apparatus of claim 2, wherein the first vent line comprises:
   an inlet line configured to supply the processing solution into the first Faraday cup, and arranged at a first distance from a bottom surface of the inner cup of the first Faraday cup; and
   a recovery line configured to supply the processing solution of which the static charge is measured from the first Faraday cup onto the substrate, and arranged at a second distance less than the first distance from the bottom surface of the inner cup of the first Faraday cup.

5. The substrate processing apparatus of claim 4, wherein the processing solution recovered to the trap tank through the recovery line comprises a smaller amount of bubbles than the processing solution supplied into the first Faraday cup through the inlet line.

6. The substrate processing apparatus of claim 2, wherein the first Faraday cup has an inner space in which an amount of about 50 mL to about 200 mL of the processing solution is stored.

7. The substrate processing apparatus of claim 1, wherein the processing solution supply apparatus further comprises:

a filter connected to the trap tank by a circulation line to filter out particles in the processing solution;
a second vent line connected to the filter to discharge the processing solution including bubbles or gases from the filter; and
a second static charge measurement unit connected to the second vent line to measure a static charge of the processing solution, and comprising a second Faraday cup and a second static charge measurement unit connected to the second Faraday cup.

8. The substrate processing apparatus of claim 7, wherein the second Faraday cup comprises:
an inner cup accommodating the processing solution supplied from the second vent line; and
an outer cup arranged apart from the inner cup by a first distance, and
the second static charge measurement unit is configured to apply a ground voltage to the inner cup and apply a Faraday measurement voltage to the outer cup.

9. The substrate processing apparatus of claim 1, wherein the processing solution comprises a photoresist solution.

10. A substrate processing apparatus comprising:
a substrate supporter supporting a substrate; and
a processing solution supply apparatus configured to supply a processing solution onto the substrate supported on the substrate supporter,
wherein the processing solution supply apparatus comprises:
a trap tank storing the processing solution;
a supply line connected to the trap tank to supply the processing solution onto the substrate;
a filter connected to the trap tank through a circulation line to receive the processing solution from the trap tank, filter out particles, and recover the filtered processing solution back to the trap tank;
a vent line connected to the trap tank or the filter to discharge the processing solution including bubbles or gases from the trap tank or the filter; and
a static charge measurement unit connected to the vent line and comprising a Faraday cup configured to measure a static charge of the processing solution, and
the Faraday cup comprises: an inner cup configured to accommodate the processing solution therein and receive a ground voltage; and an outer cup apart from the inner cup and configured to receive a Faraday measurement voltage different from the ground voltage.

11. The substrate processing apparatus of claim 10, wherein the static charge measurement unit further comprises a static charge measurement unit connected to the Faraday cup and configured to apply the ground voltage to the inner cup of the Faraday cup and apply the Faraday measurement voltage to the outer cup of the Faraday cup, and
the static charge measurement unit is configured to remove static electricity from the processing solution while the processing solution is in contact with the inner cup of the Faraday cup and the static charge of the processing solution is measured.

12. The substrate processing apparatus of claim 10, wherein the vent line comprises:
an inlet line configured to supply the processing solution into the Faraday cup, and arranged at a first distance from a bottom surface of the inner cup of the Faraday cup; and
a recovery line configured to supply the processing solution of which the static charge is measured from the Faraday cup onto the substrate, and arranged at a second distance less than the first distance from the bottom surface of the inner cup of the Faraday cup.

13. The substrate processing apparatus of claim 10, wherein the processing solution comprises a photoresist solution, and
the Faraday cup has an inner space in which an amount of about 50 mL to about 200 mL of the processing solution is stored.

14. A substrate processing method comprising:
circulating a processing solution stored in a trap tank via a filter through a circulation line connected to the trap tank;
supplying the processing solution to a static charge measurement unit comprising a Faraday cup through a vent line connected to the trap tank or the filter;
measuring a static charge of the processing solution supplied into the Faraday cup and removing static electricity of the processing solution in the Faraday cup;
recovering the processing solution of which the static charge has been measured and from which the static electricity has been removed to the trap tank through the vent line; and
spraying the processing solution stored in the trap tank onto a substrate supported by a substrate supporter.

15. The substrate processing method of claim 14, wherein the Faraday cup comprises an inner cup accommodating the processing solution therein and an outer cup apart from the inner cup, and
the static charge measurement unit further comprises a static charge measurement unit connected to the Faraday cup.

16. The substrate processing method of claim 15, wherein the static charge measurement unit is configured to apply a ground voltage to the inner cup and apply a Faraday measurement voltage to the outer cup.

17. The substrate processing method of claim 14, wherein the circulating of the processing solution is repeatedly performed n times using an initial circulation speed,
the substrate processing method further comprising measuring the static charge after repeatedly performing the circulating of the processing solution n times.

18. The substrate processing method of claim 17, further comprising adjusting the initial circulation speed of the processing solution or the number of circulation cycles by using the measured static charge.

19. The substrate processing method of claim 18, wherein the adjusting of the initial circulation speed comprises adjusting the initial circulation speed to an adjustment circulation speed when the static charge of the processing solution deviates from a target static charge range.

20. The substrate processing method of claim 19, wherein, after the adjusting of the initial circulation speed to the adjustment circulation speed, the circulating of the processing solution is repeatedly performed m times using the adjustment circulation speed,
the substrate processing method further comprising measuring the static charge after repeatedly performing the circulating of the processing solution m times.

* * * * *